(12) United States Patent
Santarelli et al.

(10) Patent No.: US 9,923,113 B2
(45) Date of Patent: Mar. 20, 2018

(54) LUMINESCENT SOLAR CONCENTRATOR COMPRISING TETRA-SUBSTITUTED BENZOHETERODIAZOLE COMPOUNDS

(71) Applicant: ENI S.p.A., Rome (IT)

(72) Inventors: Samuele Santarelli, Novara (IT); Antonio Alfonso Proto, Novara (IT)

(73) Assignee: ENI S.p.A., Rome (IT)

( * ) Notice: Subject to any disclaimer, the term of this patent is extended or adjusted under 35 U.S.C. 154(b) by 15 days.

(21) Appl. No.: 15/025,375

(22) PCT Filed: Sep. 30, 2014

(86) PCT No.: PCT/IB2014/064957
§ 371 (c)(1),
(2) Date: Mar. 28, 2016

(87) PCT Pub. No.: WO2015/049631
PCT Pub. Date: Apr. 9, 2015

(65) Prior Publication Data
US 2016/0240713 A1      Aug. 18, 2016

(30) Foreign Application Priority Data

Oct. 1, 2013   (IT) .............................. MI2013A1620

(51) Int. Cl.
| | | |
|---|---|---|
| *H01L 31/055* | (2014.01) |
| *C09K 11/06* | (2006.01) |
| *H01L 31/054* | (2014.01) |
| *H01L 31/048* | (2014.01) |

(52) U.S. Cl.
CPC ............ *H01L 31/055* (2013.01); *C09K 11/06* (2013.01); *H01L 31/048* (2013.01); *H01L 31/0547* (2014.12); *C09K 2211/1051* (2013.01); *Y02E 10/52* (2013.01)

(58) Field of Classification Search
CPC .................................................... H01L 31/055
See application file for complete search history.

(56) References Cited

U.S. PATENT DOCUMENTS

| | | | | |
|---|---|---|---|---|
| 9,315,516 B2 * | 4/2016 | Fusco | ................. | C07D 495/04 |
| 2013/0204007 A1 | 8/2013 | Santarelli et al. | | |

FOREIGN PATENT DOCUMENTS

| | | | | |
|---|---|---|---|---|
| CN | 102695776 A | 9/2012 | | |
| CN | 102931265 A | 2/2013 | | |
| CN | 103052635 A | 4/2013 | | |
| WO | WO 2013/098726 A1 | 7/2013 | | |
| WO | WO 2013098726 A1 * | 7/2013 | ............... | C09K 9/02 |

OTHER PUBLICATIONS

International Search Report dated Jan. 14, 2015 in PCT/IB2014/064957.
Combined Chinese Office Action and Search Report dated Nov. 4, 2016 in Patent Application No. 201480053879.4 (with English language translation).

* cited by examiner

*Primary Examiner* — Matthew P Coughlin
(74) *Attorney, Agent, or Firm* — Oblon, McClelland, Maier & Neustadt, L.L.P.

(57) ABSTRACT

A luminescent solar concentrator (LSC) comprising at least one tetra-substituted benzoheterodiazole compound having general formula (I): wherein: $R_1$ and $R_2$, equal to or different from each other, are selected from: $C_6$-$C_{40}$, preferably $C_6$-$C_{20}$ aryl groups, optionally substituted; $C_4$-$C_{40}$, preferably $C_5$-$C_{20}$, heteroaryl groups, optionally substituted; $R_3$ and $R_4$, equal to or different from each other, are selected from: halogen atoms such as, for example, fluorine, chlorine, bromine, iodine, preferably fluorine; linear or branched C1-C30, preferably $C_1$-$C_{20}$, trihalogenated alkyl groups; $C_6$-$C_{40}$, preferably $C_6$-$C_{20}$, aryloxyl groups optionally substituted; linear or branched $C_1$-$C_{30}$, preferably $C_1$-$C_{20}$, alkoxyl groups optionally substituted; $C_4$-$C_{40}$, preferably $C_5$-$C_{20}$, heteroaryloxyl groups optionally substituted; Z represents a sulfur atom, an oxygen atom or a selenium atom; a $NR_5$ group wherein $R_5$ represents a hydrogen atom, or it is selected from linear or branched $C_1$-$C_{24}$, preferably $C_6$-$C_{24}$, alkyl groups, optionally containing heteroatoms; a $CR_6R_7$ group wherein $R_6$ and $R_7$, equal to or different from each other, represent a hydrogen atom, or they are selected from linear or branched $C_1$-$C_{30}$, preferably $C_6$-$C_{24}$, alkyl groups, optionally containing heteroatoms, linear or branched $C_1$-$C_{30}$, preferably $C_6$-$C_{24}$, alkoxyl groups, optionally substituted, $C_3$-$C_{30}$, preferably $C_4$-$C_{24}$, cycloalkyl groups, optionally substituted, or, $R_6$ and $R_7$ can be optionally bound to each other to form, together with the other atoms to which they are bound, a cycle containing from 3 to 6 carbon atoms, saturated, unsaturated, or aromatic, optionally substituted with linear or branched $C_1$-$C_{30}$, preferably $C_1$-$C_{15}$, alkyl groups, said cycle optionally containing heteroatoms such as, for example, oxygen, sulfur, nitrogen, silicon, phosphorous, selenium.

(I)

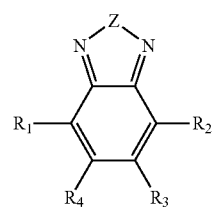

16 Claims, 1 Drawing Sheet

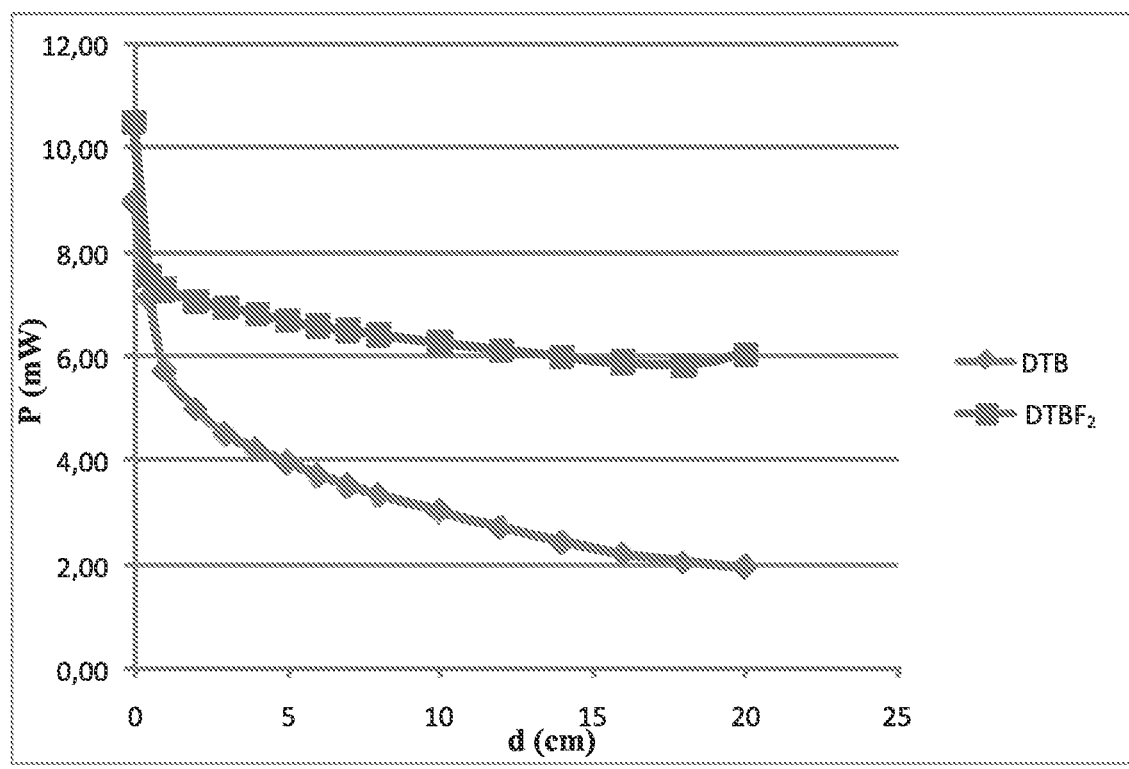

LUMINESCENT SOLAR CONCENTRATOR COMPRISING TETRA-SUBSTITUTED BENZOHETERODIAZOLE COMPOUNDS

The present invention relates to a luminescent solar concentrator (LSC) comprising at least one tetra-substituted benzoheterodiazole compound.

The present invention also relates to the use of at least one tetra-substituted benzoheterodiazole compound in the construction of luminescent solar concentrators (LSCs).

Furthermore, the present invention relates to a photovoltaic device (or solar device) selected, for example, from photovoltaic cells (or solar cells), photovoltaic modules (or solar modules), on both rigid and flexible supports, comprising a luminescent solar concentrator (LSC) including at least one tetra-substituted benzoheterodiazole compound.

It is known that neither polymer nor silicon photovoltaic cells (or solar cells) which are currently the most widely-used on the market, are capable of effectively exploiting all solar radiation. Their efficiency, in fact, is maximum only within a certain spectrum range which comprises a part of visible radiation and a part of infrared radiation.

Spectrum converter materials capable of capturing solar radiation outside the optimal spectral range and of converting it to effective radiation, can be used for enhancing the performance of photovoltaic cells (or solar cells). Luminescent solar concentrators (LSCs) can be produced also with these materials, which allow a further increase in the production of current in photovoltaic cells (or solar cells).

Said luminescent solar concentrators (LSCs) generally consist of large sheets of material transparent to solar radiation, in which fluorescent substances are dispersed or chemically bound to said material, which act as spectrum converters. Due to the effect of the optical phenomenon of total reflection, the radiation emitted by the fluorescent molecules is "guided" towards the thin edges of the sheet where it is concentrated on photovoltaic cells (or solar cells) positioned therein. In this way, large surfaces of low-cost materials (photoluminescent sheets) can be used for concentrating the light on small surfaces of high-cost materials [photovoltaic cells (or solar cells)].

A fluorescent compound should have numerous characteristics for being advantageously used in the construction of luminescent solar concentrators (LSCs) and these are not always compatible with each other.

First of all, the frequency of the radiation emitted by fluorescence must correspond to an energy higher than the threshold value below which the semiconductor, which represents the core of the photovoltaic cell (or solar cell), is no longer able to function.

Secondly, the absorption spectrum of the fluorescent compound should be as extensive as possible, so as to absorb most of the inciding solar radiation and then re-emit it at the desired frequency.

It is also desirable that the absorption of the solar radiation be extremely intense, so that the fluorescent compound can exert its function at the lowest possible concentrations, avoiding the use of large quantities.

Furthermore, the absorption process of solar radiation and its subsequent re-emission at lower frequencies, must take place with the highest possible efficiency, minimizing the so-called non-radiative losses, often collectively indicated with the term "thermalization": the efficiency of the process is measured by its quantic yield.

Finally, the absorption and the emission frequencies must be as diverse as possible, as otherwise the radiation emitted by a molecule of the fluorescent compound would be absorbed and at least partially diffused by the adjacent molecules. Said phenomenon, generally called self-absorption, inevitably leads to a significant loss in efficiency. The difference between the frequencies of the peak with the lower frequency of the absorption spectrum and of the peak of the radiation emitted, is normally indicated as Stokes shift and measured as nm (i.e. it is not the difference between the two frequencies that is measured, but the difference between the two wavelengths corresponding to them). High Stokes shifts are absolutely necessary for obtaining high efficiencies of luminescent solar concentrators (LSCs), bearing in mind the necessity, already mentioned, that the frequency of the radiation emitted corresponds to an energy higher than the threshold value below which the photovoltaic cell (or solar cell) is not able to function.

It is known that some benzothiadiazole compounds, in particular 4,7-di-(thien-2'-yl)-2,1,3-benzothiadiazole (DTB), are fluorescent compounds which can be used in the construction of luminescent solar concentrators (LSCs). Compounds of this type are described in international patent application WO 2011/048458 in the name of the Applicant.

4,7-di-(thien-2'-yl)-2,1,3-benzothiadiazole (DTB) is characterized by an emission centred around 579 nm, which corresponds to an energy value well above the minimum threshold value for the functioning of photovoltaic cells (or solar cells), a threshold that, for example, corresponds to a wavelength of about 1100 nm for the most widely-used photovoltaic cells (or solar cells), based on silicon. Furthermore, its absorption of light radiation is intense and extends over a relatively wide range of wavelengths, indicatively ranging from 550 nm (green radiation wavelength) to ultraviolet. Finally, 4,7-di-(thien-2'-yl)-2,1,3-benzothiadiazole (DTB) has a Stokes shift in a dichloromethane solution, equal to 134 nm, well above that of most of the commercial products so far proposed for use in luminescent solar concentrators (LSCs).

For these reasons, the use of 4,7-di-(thien-2'-yl)-2,1,3-benzothiadiazole (DTB) has enabled the production of excellent-quality luminescent solar concentrators (LSCs).

However, although 4,7-di-(thien-2'-yl)-2,1,3-benzothiadiazole (DTB) absorbs a significant part of the solar spectrum, and although it has a high fluorescence quantum yield ($\Phi$), which is defined according to the equation (1) indicated hereunder as the ratio between the number of photons emitted and the number of photons absorbed by a luminescent molecule per time unit:

$$(\Phi) = \text{number of photons emitted/number of photons absorbed} \qquad (1)$$

and is equal to 0.9 (it should be noted that the maximum value is equal to 1), it also has a significant photodegradability.

Said fluorescence quantum yield ($\Phi$), has been measured in anhydrous dichloromethane ($CH_2Cl_2$), at room temperature (25° C.), according to techniques known in the art, as described, for example, by J. R. Lakowicz in "*Principles of Fluorescence Spectroscopy*" (2006), Third Ed., Springer.

The Applicant has therefore considered the problem of finding compounds having a higher fluorescence quantum yield ($\Phi$) and a lower photodegradability.

The Applicant has now found that tetra-substituted benzoheterodiazole compounds having a specific general formula (i.e. having general formula (I) indicated hereunder) can be advantageously used in the construction of luminescent solar concentrators (LSCs). Said luminescent solar concentrators (LSCs) can be advantageously used in the construction of photovoltaic devices (or solar devices) such as, for example, photovoltaic cells (or solar cells), photovoltaic modules (or solar modules), on both rigid and flexible supports. Said tetra-substituted benzoheterodiazole compounds, in fact, have a higher fluorescence quantum yield (Φ), therefore allowing an improvement in the spectrum conversion process, with a consequent improvement in the performances of the luminescent solar concentrators (LSCs) and of the photovoltaic devices (or solar devices) in which they are used. Furthermore, thanks to the presence of the substituents $R_3$ and $R_4$, said tetra-substituted benzoheterodiazole compounds have a lower photodegradability, with a consequent longer duration of the luminescent solar concentrators (LSCs) and of the photovoltaic devices (or solar devices) in which they are used.

An object of the present invention therefore relates to a luminescent solar concentrator (LSC) comprising at least one tetra-substituted benzoheterodiazole compound having general formula (I):

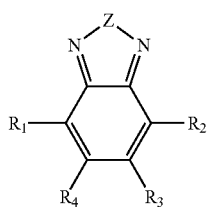

(I)

wherein:
- $R_1$ and $R_2$, equal to or different from each other, are selected from: $C_6$-$C_{40}$, preferably $C_6$-$C_{20}$, aryl groups, optionally substituted; $C_4$-$C_{40}$, preferably $C_5$-$C_{20}$, heteroaryl groups, optionally substituted;
- $R_3$ and $R_4$, equal to or different from each other, are selected from: halogen atoms such as, for example, fluorine, chlorine, bromine, iodine, preferably fluorine; linear or branched $C_1$-$C_{30}$, preferably $C_1$-$C_{20}$, trihalogenated alkyl groups; $C_6$-$C_{40}$, preferably $C_6$-$C_{20}$, aryloxyl groups optionally substituted; linear or branched $C_1$-$C_{30}$, preferably $C_1$-$C_{20}$, alkoxyl groups optionally substituted; $C_4$-$C_{40}$, preferably $C_5$-$C_{20}$, heteroaryloxyl groups optionally substituted;
- Z represents a sulfur atom, an oxygen atom, or a selenium atom; a $NR_5$ group wherein $R_5$ represents a hydrogen atom, or it is selected from linear or branched $C_1$-$C_{30}$, preferably $C_6$-$C_{24}$, alkyl groups, optionally containing heteroatoms; a $CR_6R_7$ group wherein $R_6$ and $R_7$, equal to or different from each other, represent a hydrogen atom, or they are selected from linear or branched $C_1$-$C_{30}$, preferably $C_6$-$C_{24}$, alkyl groups, optionally containing heteroatoms, linear or branched $C_1$-$C_{30}$, preferably $C_6$-$C_{24}$, alkoxyl groups, optionally substituted, $C_3$-$C_{30}$, preferably $C_4$-$C_{24}$, cycloalkyl groups, optionally substituted, or, $R_6$ and $R_7$ can be optionally bound to each other to form, together with the other atoms to which they are bound, a cycle containing from 3 to 6 carbon atoms, saturated, unsaturated, or aromatic, optionally substituted with linear or branched $C_1$-$C_{30}$, preferably $C_1$-$C_{15}$, alkyl groups, said cycle optionally containing heteroatoms such as, for example, oxygen, sulfur, nitrogen, silicon, phosphorous, selenium.

According to a preferred embodiment of the present invention, in said general formula (I):

$R_1$ and $R_2$, the same as each other, are a heteroaryl group, preferably a thienyl group;
$R_3$ and $R_4$, the same as each other, represent a halogen atom, preferably fluorine;
Z represents a sulfur atom.

A particularly preferred aspect of the present invention therefore relates to a luminescent solar concentrator (LSC) comprising 5,6-difluoro-4,7-di(thien-2'-yl)-2,1,3-benzothiadiazole (DTBF$_2$) having formula (Ia):

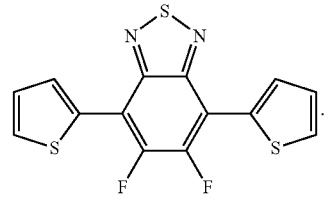

(Ia)

As indicated above, tetra-substituted benzoheterodiazole compounds having general formula (I) have a higher fluorescence quantum yield (Φ) with respect to that of 4,7-di-(thien-2'-yl)-2,1,3-benzothiadiazole (DTB). 5,6-difluoro-4,7-di(thien-2'-yl)-2,1,3-benzothiadiazole (DTBF$_2$) having formula (Ia), for example, has a fluorescence quantum yield (Φ), measured under the same operative conditions used for 4,7-di-(thien-2'-yl)-2,1,3-benzothiadiazole (DTB), equal to 0.98.

For the aim of the present description and of the following claims, the definitions of the numerical ranges always comprise the extremes unless otherwise specified.

For the aim of the present description and of the following claims, the term "comprising" also includes the terms "which essentially consists of" or "which consists of".

The term "$C_6$-$C_{40}$ aryl groups" refers to aromatic, monocyclic or polycyclic groups, with condensed rings or covalently bound, containing from 6 to 40 carbon atoms. Said aryl groups can be optionally substituted with one or more groups, equal to or different from each other, selected from: linear or branched $C_1$-$C_{20}$ alkyl groups, optionally containing heteroatoms; $C_3$-$C_{10}$ cycloalkyl groups, optionally substituted; $C_6$-$C_{20}$ aryl groups, optionally substituted; $C_1$-$C_{20}$ alkoxyl groups, optionally substituted; hydroxyl groups; cyano groups; amine groups. Specific examples of aryl groups are: phenyl, methylphenyl, trimethylphenyl, methoxyphenyl, hydroxyphenyl, phenyloxyphenyl, dimethylaminophenyl, naphthyl, phenylnaphthyl, phenanthrenyl, anthracenyl, azulenyl, perylenyl.

The term "$C_4$-$C_{40}$ heteroaryl groups" refers to aromatic heterocyclic groups, also benzocondensed or heterobicyclic, containing from 4 to 40 carbon atoms and from 1 to 4 heteroatoms selected from nitrogen, oxygen, sulfur, silicon, selenium, phosphorus. Said heteroaryl groups can be optionally substituted with one or more groups, equal to or different from each other, selected from: linear or branched $C_1$-$C_{20}$ alkyl groups, optionally containing heteroatoms; $C_3$-$C_{10}$ cycloalkyl groups, optionally substituted; $C_6$-$C_{20}$ aryl groups, optionally substituted; $C_1$-$C_{20}$ alkoxyl groups, optionally substituted; hydroxyl groups; cyano groups; amine groups. Specific examples of heteroaryl groups are: pyridyl, methylpyridyl, phenylpyridyl, pyrimidyl, pyridazyl, pyrazyl, triazyl, tetrazyl, quinolyl, quinoxalyl, quinazolyl, furanyl, thienyl, hexylthienyl, pyrrolyl, oxazolyl, triazolyl, isoxazolyl, isothiazolyl, oxadiazolyl, thiadiazolyl, pyrazolyl, imidazolyl, triazolyl, tetrazolyl, indolyl, benzofuranyl, benzothiophenyl, benzoxazolyl, benzothiazolyl, benzoxadiazolyl, benzothiadiazolyl, benzopyrazolyl, benzimidazolyl, benzotriazolyl, triazolopyridinyl, triazolopyrimidyl, cumaryl.

The term "$C_1$-$C_{30}$ alkyl groups" refers to linear or branched alkyl groups having from 1 to 30 carbon atoms. Specific examples of $C_1$-$C_{30}$ alkyl groups are: methyl, ethyl, n-propyl, iso-propyl, n-butyl, iso-butyl, t-butyl, pentyl, ethyl-hexyl, hexyl, heptyl, octyl, nonyl, decyl, dodecyl.

The term "$C_1$-$C_{30}$ alkyl groups optionally containing heteroatoms" refers to linear or branched alkyl groups having from 1 to 30 carbon atoms, wherein at least one of the hydrogen atoms is substituted with a heteroatom selected from: oxygen, sulfur, nitrogen, silicon, phosphorous. Specific examples of $C_1$-$C_{30}$ alkyl groups optionally containing heteroatoms are: oxymethyl, thiomethyl, thioethyl, dimethylamine, propylamine, dioctylamine.

The term "$C_3$-$C_{30}$ cycloalkyl groups" refers to cycloalkyl groups having from 3 to 30 carbon atoms. Said cycloalkyl groups can be optionally substituted with one or more groups, equal to or different from each other, selected from: hydroxyl groups; linear or branched $C_1$-$C_{20}$ alkyl groups, optionally containing heteroatoms; $C_1$-$C_{20}$ alkoxyl groups, optionally substituted; cyano groups; amine groups; $C_6$-$C_{20}$ aryl groups, optionally substituted. Specific examples of $C_3$-$C_{30}$ cycloalkyl groups are: cyclopropyl, 1,4-dioxine, 2,2-difluorocyclopropyl, cyclobutyl, cyclopentyl, cyclohexyl, methylcyclohexyl, methoxycyclohexyl, fluorocyclohexyl, phenylcyclohexyl.

The term "$C_1$-$C_{30}$ alkoxyl groups" refers to linear or branched alkoxyl groups having from 1 to 30 carbon atoms. Said alkoxyl groups can be optionally substituted with one or more groups, equal to or different from each other, selected from: halogen atoms such as, for example, fluorine, chlorine, preferably fluorine; hydroxyl groups; linear or branched $C_1$-$C_{20}$ alkyl groups, optionally containing heteroatoms; $C_1$-$C_{20}$ alkoxyl groups, optionally substituted; cyano groups; amine groups. Specific examples of $C_1$-$C_{30}$ alkoxyl groups are: methoxyl, ethoxyl, fluoroethoxyl, n-propoxyl, iso-propoxyl, n-butoxyl, fluoro-n-butoxyl, iso-butoxyl, t-butoxyl, pentoxyl, hexyloxyl, heptyloxyl, octyloxyl, nonyloxyl, decyloxyl, dodecyloxyl.

The term "cycle" relates to a system containing a ring containing from 3 to 6 carbon atoms, optionally containing heteroatoms selected from nitrogen, oxygen, sulfur, silicon, selenium, phosphorous. Specific examples of a cycle are: toluene, benzonitrile, cycloheptatriene, cyclooctadiene, pyridine, thiadiazole, pyrrole, thiophene, selenophene, t-butylpyridine.

The term "$C_1$-$C_{30}$ trihalogenated alkyl groups" refers to linear or branched alkyl groups having from 1 to 30 carbon atoms, in which three hydrogen atoms are substituted with three halogen atoms. Specific examples of $C_1$-$C_{30}$ trihalogenated alkyl groups are: trifluoromethyl, trifluoroethyl, trifluoropropyl, trifluorobutyl, trichloromethyl, trichloroethyl, trichloropropyl, trichlorobutyl, (dichloro)fluoromethyl, (dichloro)fluoroethyl, (dichloro)fluoropropyl, (dichloro)fluorobutyl, chloro(difluoro)methyl, chloro(difluoro)ethyl, chloro(difluoro)propyl, chloro(difluoro)butyl.

The term "$C_6$-$C_{40}$ aryloxyl groups" refers to groups having an oxygen atom attached to the aryl group. Said aryloxyl groups can be optionally substituted with one or more groups, equal to or different from each other, selected from: linear or branched $C_1$-$C_{20}$ alkyl groups, optionally containing heteroatoms; $C_3$-$C_{10}$ cycloalkyl groups, optionally substituted; $C_6$-$C_{20}$ aryl groups, optionally substituted; $C_1$-$C_{20}$ alkoxyl groups, optionally substituted; hydroxyl groups; cyano groups; amine groups. Specific examples of $C_6$-$C_{40}$ aryloxyl groups are: phenoxyl, naphthyloxyl, methylphenoxyl, trimethylphenoxyl, hydroxyphenoxyl, dimethylaminophenoxyl, phenyloxynaphthyl, phenanthrenyloxyl, anthracenyloxyl, benzyloxyl, azulenyloxyl, peryleneoxyl.

The term "$C_4$-$C_{40}$ heteroaryloxyl groups" refers to aromatic heterocyclic groups, also benzocondensed or heterobicyclic, containing from 4 to 40 carbon atoms and from 1 to 4 heteroatoms selected from nitrogen, oxygen, sulfur, silicon, selenium, phosphorus, having an oxygen atom attached to the heteroaryl group. Said heteroaryloxyl groups can be optionally substituted with one or more groups, equal to or different from each other, selected from: linear or branched $C_1$-$C_{20}$ alkyl groups, optionally containing heteroatoms; $C_3$-$C_{10}$ cycloalkyl groups, optionally substituted; $C_6$-$C_{20}$ aryl groups, optionally substituted; $C_1$-$C_{20}$ alkoxyl groups, optionally substituted; hydroxyl groups, cyano groups; amine groups. Specific examples of $C_4$-$C_{40}$ heteroaryloxyl groups are: pyridyloxyl, methylpyridyloxyl, phenylpyridyloxyl, pyrimidyloxyl, pyridazyloxyl, pyrazyloxyl, triazyloxyl, tetrazyloxyl, quinolyloxyl, quinoxalyloxyl, quinazolyloxyl, furanyloxyl, thienyloxyl, hexylthienyloxyl, pyrrolyloxyl, oxazolyloxyl, triazolyloxyl, isoxazolyloxyl, isothiazolyloxyl, oxadiazolyloxyl, thiadiazolyloxyl, pyrazolyloxyl, imidazolyloxyl, triazolyloxyl, tetrazolyloxyl, indolyloxyl, benzofuranyloxyl, benzothiophenyloxyl, benzoxazolyloxyl, benzo-thiazolyloxyl, benzoxadiazolyloxyl, benzothia-diazolyloxyl, benzopyrazolyloxyl, benzimidazolyloxyl, benzotriazolyloxyl, triazolopyridinyloxyl, triazole-pyrimidyloxyl, cumaryloxyl.

Said compound having general formula (I) can be obtained according to processes known in the art as described, for example, in american patent application US 2012/0232237.

Or, said compound having general formula (I) can be easily found on the market.

A further object of the present invention also relates to the use of at least one tetra-substituted benzoheterodiazole compound having general formula (I) in the construction of luminescent solar concentrators (LSCs).

The tetra-substituted benzoheterodiazole compound having general formula (I) can be used in said luminescent solar concentrator (LSC) in the following forms: dispersed in the polymer or in the glass, chemically bound to the polymer or to the glass, in solution, in gel form.

The luminescent solar concentrator (LSC) can contain, for example, a transparent matrix, wherein the term "transparent matrix" refers to any transparent material used in the form of a carrier, ligand, or a material in which at least one tetra-substituted benzoheterodiazole compound having general formula (I) is dispersed or englobed. The material used for the matrix is transparent, as such, to the radiations of interest and, in particular, to radiations having a frequency within the effective spectrum of the photovoltaic device (or solar device) such as, for example, of the photovoltaic cell (or solar cell) in which it is used. Materials suitable for the aim of the present invention can therefore be selected from materials transparent at least to radiations having a wavelength ranging from 250 nm to 1100 nm.

The transparent matrix that can be used for the aim of the present invention can be selected, for example, from polymeric or vitreous materials. Said matrix is characterized by a high transparency and a high duration with respect to heat and light. Polymeric materials which can be advantageously used for the aim of the present invention are, for example, polymethylmethacrylate (PMMA), epoxy resins, silicon resins, polyalkylene terephthalates, polycarbonates, polystyrene, polypropylene. Vitreous materials which can be advantageously used for the aim of the present invention are, for example, silicas.

If the matrix is of the polymeric type, said at least one tetra-substituted benzoheterodiazole compound having general formula (I) can be dispersed in the polymer of said matrix by means, for example, of melt dispersion, or mass additivation, and subsequent formation of a sheet comprising said polymer and said at least one tetra-substituted benzoheterodiazole compound having general formula (I), operating, for example, according to the technique known as "casting". Alternatively, said at least one tetra-substituted benzoheterodiazole compound having general formula (I) and the polymer of said matrix can be solubilized in at least one solvent obtaining a solution which is deposited on a sheet of said polymer, forming a film comprising said at least one tetra-substituted benzoheterodiazole compound having general formula (I) and said polymer, operating, for example, with the use of a Doctor Blade-type film applicator: said solvent is subsequently left to evaporate.

If the matrix is of the vitreous type, said at least one tetra-substituted benzoheterodiazole compound having general formula (I) can be solubilized in at least one solvent obtaining a solution which is deposited on a sheet of said matrix of the vitreous type, forming a film comprising said at least one tetra-substituted benzoheterodiazole compound having general formula (I), operating, for example, with the use of a Doctor Blade-type film applicator: said solvent is subsequently left to evaporate.

Alternatively, a sheet comprising said at least one tetra-substituted benzoheterodiazole compound and said polymer obtained as described above, by melt dispersion, or mass additivation, and subsequent casting, can be sandwiched between two sheets of said transparent matrix of the vitreous type operating according to the known lamination technique.

A further object of the present invention also relates to a photovoltaic device (or solar device) selected, for example, from photovoltaic cells (or solar cells), photovoltaic modules (or solar modules), on both rigid and flexible supports, comprising a luminescent solar concentrator (LSC) including at least one tetra-substituted benzoheterodiazole compound having general formula (I).

Said photovoltaic device (or solar device) can be obtained, for example, by assembling the above luminescent solar concentrator with a photovoltaic cell (or solar cell).

According to a preferred embodiment of the present invention, the above solar concentrator can be produced in the form of a transparent sheet obtained through the solubilization of said at least one tetra-substituted benzoheterodiazole compound having general formula (I) and the polymer of the matrix of the polymeric type, in at least one solvent, obtaining a solution which is deposited on a sheet of said polymer forming a film comprising said at least one tetra-substituted benzoheterodiazole compound having general formula (I) and said polymer, operating, for example, with the use of a Doctor Blade-type film applicator: said solvent is subsequently left to evaporate. In said photovoltaic devices (or solar devices), said sheets can then be coupled with a photovoltaic cell (or solar cell).

Some illustrative and non-limiting examples are provided hereunder for a better understanding of the present invention and for its embodiment.

4,7-di-(thien-2'-yl)-2,1,3-benzothiadiazole (DTB) was obtained as described in patent application MI2010A001316 in the name of the Applicant, whose content is incorporated herein as reference.

EXAMPLE 1

6 g of polymethylmethacrylate Altuglas VSUVT 100 (PMMA) and 60.5 mg of 5,6-difluoro-4,7-di(thien-2'-yl)-2,1,3-benzothiadiazole ($DTBF_2$) of Santai Labs, were dissolved in 30 ml of 1,2-dichlorobenzene (Aldrich). The solution obtained was then uniformly deposited on a sheet of polymethylmethacrylate (PMMA) (dimensions 300 mm×90 mm×6 mm)) using a Doctor Blade-type film applicator and the solvent was left to evaporate at room temperature (25° C.), in a light stream of air, for hours. A yellow-coloured transparent sheet was obtained (sheet 1), the colour being conferred to it by the film, whose thickness proved to range from 100 μm to 50 μm.

A photovoltaic cell IXYS-KXOB22-12 having a surface of 1.2 $cm^2$ was then applied to one of the edges of the polymeric sheet.

The main side of the polymeric sheet [that covered by the thin film containing 5,6-difluoro-4,7-di(thien-2'-yl)-2,1,3-benzothiadiazole ($DTBF_2$)] was then illuminated with a light source having a power of 1 sun (1000 W/$m^2$) and the electric power generated by the effect of the illumination was measured.

The power measurements (P) were carried out by illuminating a portion of sheet having dimensions of 100 mm×90 mm, at an increasing distance (d) from the edge on which the photovoltaic cell was fixed. These measurements, at a variable distance from the photovoltaic cell, allow the contribution of optional waveguide, edge, scattering and self-absorption effects, to be quantified.

FIG. 1 shows the curve relating to the value of the power (P) generated, expressed in mW (indicated in the ordinate), in relation to the distance (d) from the edge on which the photovoltaic cell was fixed, expressed in cm (indicated in the abscissa).

It can be seen that, in the absence of edge effects, the average power generated is equal to a 6.55 mW (FIG. 1).

EXAMPLE 2 (COMPARATIVE)

6 g of polymethylmethacrylate Altuglas VSUVT 100 (PMMA) and 49.5 mg of 4,7-di-(thien-2'-yl)-2,1,3-benzothiadiazole (DTB), were dissolved in 30 ml of 1,2-dichlorobenzene (Aldrich). The solution obtained was then uniformly deposited on a sheet of polymethylmethacrylate (PMMA) (dimensions 300 mm×90 mm×6 mm)) using a Doctor Blade-type film applicator and the solvent was left to evaporate at room temperature (25° C.), in a light stream of air, for 24 hours. A yellow-coloured transparent sheet was obtained (sheet 2), the colour being conferred to it by the film, whose thickness proved to range from 100 μm to 50 μm.

A photovoltaic cell IXYS-KXOB22-12 having a surface of 1.2 $cm^2$ was then applied to one of the edges of the polymeric sheet.

The main side of the polymeric sheet [that covered by the thin film containing 4,7-di-(thien-2'-yl)-2,1,3-benzothiadiazole (DTB)] was then illuminated with a light source having a power of 1 sun (1000 W/$m^2$) and the electric power generated by the effect of the illumination was measured The power measurements (P) were carried out by illuminating a portion of sheet having dimensions of 100 mm×90 mm, at an increasing distance (d) from the edge on which the photovoltaic cell was fixed. These measurements, at a variable distance from the photovoltaic cell, allow the contribution of optional waveguide, edge and self-absorption effects, to be quantified.

FIG. 1 shows the curve relating to the value of the power (P) generated, expressed in mW (indicated in the ordinate), in relation to the distance (d) from the edge on which the photovoltaic cell was fixed, expressed in cm (indicated in the abscissa).

It can be seen that, in the absence of edge effects, the average power generated is equal to 3.69 mW (FIG. 1), consequently lower than that generated using 5,6-difluoro-4,7-di(thien-2'-yl)-2,1,3-benzothiadiazole (DTBF$_2$) (Example 1) according to the present invention.

The invention claimed is:

1. A luminescent solar concentrator (LSC) comprising a tetra-substituted benzoheterodiazole compound of formula (I):

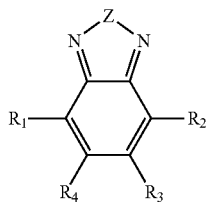

wherein:

$R_1$ and $R_2$, equal to or different from each other, are selected from: $C_6$-$C_{40}$ aryl groups, optionally substituted; and a heteroaryl group selected from the group consisting of pyridyl, methylpyridyl, phenylpyridyl, pyrimidyl, pyridazyl, pyrazyl, triazyl, tetrazyl, quinolyl, quinoxalyl, quinazolyl, furanyl, thienyl, hexylthienyl, pyrrolyl, oxazolyl, thiazolyl, isoxazolyl, isothiazolyl, oxadiazolyl, thiadiazolyl, pyrazolyl, imidazolyl, triazolyl, tetrazolyl, indolyl, benzofuranyl, benzothiophenyl, benzoxazolyl, benzothiazolyl, benzoxadiazolyl, benzothiadiazolyl, benzopyrazolyl, benzimidazolyl, benzotriazolyl, triazolopyridinyl, triazolopyrimidyl, and cumaryl;

$R_3$ and $R_4$, equal to or different from each other, are selected from: halogen atoms linear or branched trihalogenated $C_1$-$C_{10}$ alkyl groups; $C_6$-$C_{40}$ aryloxyl groups optionally substituted; linear or branched $C_1$-$C_{30}$ alkoxyl groups optionally substituted; $C_4$-$C_{40}$ heteroaryloxyl groups optionally substituted;

Z represents a sulfur atom, an oxygen atom, or a selenium atom; a $NR_5$ group wherein $R_5$ represents a hydrogen atom, or it is selected from linear or branched $C_1$-$C_{30}$ alkyl groups, optionally containing heteroatoms; a $CR_6R_7$ group wherein $R_6$ and $R_7$, equal to or different from each other, represent a hydrogen atom, or they are selected from linear or branched $C_1$-$C_{30}$ alkyl groups, optionally containing heteroatoms, linear or branched $C_1$-$C_{30}$ alkoxyl groups, optionally substituted, $C_3$-$C_{30}$ cycloalkyl groups, optionally substituted, or $R_6$ and $R_7$ can be optionally bound to each other to form, together with the other atoms to which they are bound, a cycle containing from 3 to 6 carbon atoms, saturated, unsaturated, or aromatic, optionally substituted with linear or branched $C_1$-$C_{30}$ alkyl groups, said cycle optionally containing heteroatoms.

2. The luminescent solar concentrator (LSC) according to claim 1, wherein, in formula (I):
$R_1$ and $R_2$, the same as each other, are a heteroaryl group;
$R_3$ and $R_4$, the same as each other, represent a halogen atom; and
Z represents a sulfur atom.

3. A luminescent solar concentrator (LSC) comprising 5,6-difluoro-4,7-di(thien-2'-yl)-2,1,3-benzothiadiazole (DTBF$_2$) of formula (Ia):

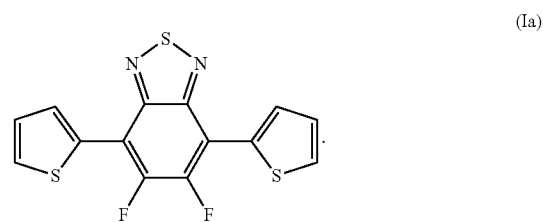

4. A method, comprising constructing a luminescent solar concentrator by employing a tetra-substituted benzoheterodiazole compound of formula (I):

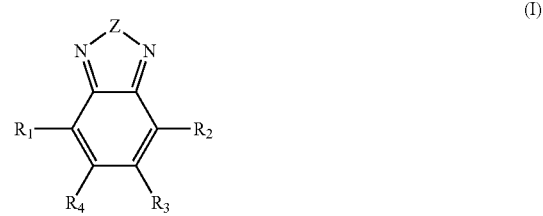

wherein:

$R_1$ and $R_2$, equal to or different from each other, are selected from: $C_6$-$C_{40}$ aryl groups, optionally substituted; and a heteroaryl group selected from the group consisting of pyridyl, methylpyridyl, phenylpyridyl, pyrimidyl, pyridazyl, pyrazyl, triazyl, tetrazyl, quinolyl, quinoxalyl, quinazolyl, furanyl, thienyl, hexylthienyl, pyrrolyl, oxazolyl, thiazolyl, isoxazolyl, isothiazolyl, oxadiazolyl, thiadiazolyl, pyrazolyl, imidazolyl, triazolyl, tetrazolyl, indolyl, benzofuranyl, benzothiophenyl, benzoxazolyl, benzothiazolyl, benzoxadiazolyl, benzothiadiazolyl, benzopyrazolyl, benzimidazolyl, benzotriazolyl, triazolopyridinyl, triazolopyrimidyl, and cumaryl;

$R_3$ and $R_4$, equal to or different from each other, are selected from: halogen atoms; linear or branched trihalogenated $C_1$-$C_{10}$ alkyl groups; $C_6$-$C_{40}$ aryloxyl groups optionally substituted; linear or branched $C_1$-$C_{30}$ alkoxyl groups optionally substituted; $C_4$-$C_{40}$ heteroaryloxyl groups optionally substituted;

Z represents a sulfur atom, an oxygen atom, or a selenium atom; a $NR_5$ group wherein $R_5$ represents a hydrogen atom, or it is selected from linear or branched $C_1$-$C_{30}$ alkyl groups, optionally containing heteroatoms; a $CR_6R_7$ group wherein $R_6$ and $R_7$, equal to or different from each other, represent a hydrogen atom, or they are selected from linear or branched $C_1$-$C_{30}$ alkyl groups, optionally containing heteroatoms, linear or branched $C_1$-$C_{30}$ alkoxyl groups, optionally substituted, $C_3$-$C_{30}$ cycloalkyl groups, optionally substituted, or $R_6$ and $R_7$ can be optionally bound to each other to form, together with the other atoms to which they are bound, a cycle containing from 3 to 6 carbon atoms, saturated, unsaturated, or aromatic, optionally substituted with linear or branched $C_1$-$C_{30}$ alkyl groups, said cycle optionally containing heteroatoms.

5. The method according to claim 4, wherein, in formula (I):
$R_1$ and $R_2$, the same as each other, are a heteroaryl group;
$R_3$ and $R_4$, the same as each other, represent a halogen atom; and
Z represents a sulfur atom.

6. The method according to claim 4, wherein the tetra-substituted benzoheterodiazole compound of formula (I) is 5,6-difluoro-4,7-di(thien-2'-yl)-2,1,3-benzothiadiazole ($DTBF_2$) of formula (Ia):

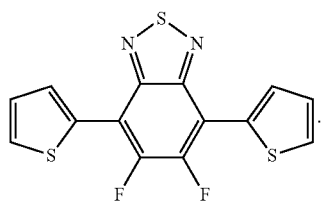

(Ia)

7. A photovoltaic device selected from a photovoltaic cell and a photovoltaic module, on a rigid or flexible support comprising a luminescent solar concentrator comprising a tetra-substituted benzoheterodiazole compound of formula (I) according to claim 1.

8. The luminescent solar concentrator (LSC) according to claim 1, wherein, in formula (I):
$R_1$ and $R_2$, the same as each other, are a thienyl group;
$R_3$ and $R_4$, the same as each other, represent a fluorine atom; and
Z represents a sulfur atom.

9. The method of claim 4, wherein, in formula (I):
$R_1$ and $R_2$, the same as each other, are a thienyl group;
$R_3$ and $R_4$, the same as each other, represent a fluorine atom; and
Z represents a sulfur atom.

10. A solar device selected from a solar cell and a solar module, on a rigid or flexible support, comprising a luminescent solar concentrator comprising a tetra-substituted benzoheterodiazole compound of formula (I) according to claim 1.

11. The luminescent solar concentrator (LSC) according to claim 1, wherein, in formula (I):
$R_1$ and $R_2$, equal to or different from each other, are a heteroaryl group selected from the group consisting of pyridyl, methylpyridyl, phenylpyridyl, pyrimidyl, pyridazyl, pyrazyl, triazyl, tetrazyl, quinolyl, quinoxalyl, quinazolyl, furanyl, thienyl, hexylthienyl, pyrrolyl, oxazolyl, thiazolyl, isoxazolyl, isothiazolyl, oxadiazolyl, thiadiazolyl, pyrazolyl, imidazolyl, triazolyl, tetrazolyl, indolyl, benzofuranyl, benzothiophenyl, benzoxazolyl, benzothiazolyl, benzoxadiazolyl, benzothiadiazolyl, benzopyrazolyl, benzimidazolyl, benzotriazolyl, triazolopyridinyl, triazolopyrimidyl, and cumaryl, and
$R_3$ and $R_4$, equal to or different from each other, represent a halogen atom.

12. The luminescent solar concentrator (LSC) according to claim 1, wherein, in formula (I): $R_3$ and $R_4$, equal to or different from each other, are a halogen atom selected from the group consisting of fluorine, chlorine, bromine, and iodine.

13. The luminescent solar concentrator (LSC) according to claim 1, wherein, in formula (I): Z represents a $CR_6R_7$ group wherein $R_6$ and $R_7$ are bound to each other to form, together with the other atoms to which they are bound, a cycle containing from 3 to 6 carbon atoms, saturated, unsaturated, or aromatic, optionally substituted with linear or branched $C_1$-$C_{30}$ alkyl groups, said cycle containing heteroatoms selected from the group consisting of oxygen, sulfur, nitrogen, silicon, phosphorous, and selenium.

14. The method according to claim 4, wherein, in formula (I):
$R_1$ and $R_2$, equal to or different from each other, are a heteroaryl group selected from the group consisting of pyridyl, methylpyridyl, phenylpyridyl, pyrimidyl, pyridazyl, pyrazyl, triazyl, tetrazyl, quinolyl, quinoxalyl, quinazolyl, furanyl, thienyl, hexylthienyl, pyrrolyl, oxazolyl, thiazolyl, isoxazolyl, isothiazolyl, oxadiazolyl, thiadiazolyl, pyrazolyl, imidazolyl, triazolyl, tetrazolyl, indolyl, benzofuranyl, benzothiophenyl, benzoxazolyl, benzothiazolyl, benzoxadiazolyl, benzothiadiazolyl, benzopyrazolyl, benzimidazolyl, benzotriazolyl, triazolopyridinyl, triazolopyrimidyl, and cumaryl, and
$R_3$ and $R_4$, equal to or different from each other, represent a halogen atom.

15. The method according to claim 4, wherein, in formula (I): $R_3$ and $R_4$, equal to or different from each other, are a halogen atom selected from the group consisting of fluorine, chlorine, bromine, and iodine.

16. The method according to claim 4, wherein, in formula (I): Z represents a $CR_6R_7$ group wherein $R_6$ and $R_7$ are bound to each other to form, together with the other atoms to which they are bound, a cycle containing from 3 to 6 carbon atoms, saturated, unsaturated, or aromatic, optionally substituted with linear or branched $C_1$-$C_{30}$ alkyl groups, said cycle containing heteroatoms selected from the group consisting of oxygen, sulfur, nitrogen, silicon, phosphorous, and selenium.

* * * * *